US008860031B2

(12) United States Patent
Mori

(10) Patent No.: US 8,860,031 B2
(45) Date of Patent: Oct. 14, 2014

(54) NON-VOLATILE SEMICONDUCTOR MEMORY DEVICE AND METHOD OF MANUFACTURING THE SAME

(75) Inventor: Shinji Mori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 13/423,955

(22) Filed: Mar. 19, 2012

(65) Prior Publication Data

US 2013/0069118 A1 Mar. 21, 2013

(30) Foreign Application Priority Data

Sep. 21, 2011 (JP) ................................ 2011-205752

(51) Int. Cl.
*H01L 27/105* (2006.01)
*H01L 21/20* (2006.01)
*H01L 29/78* (2006.01)
*H01L 29/66* (2006.01)
*H01L 27/115* (2006.01)
*H01L 29/792* (2006.01)
*H01L 21/02* (2006.01)

(52) U.S. Cl.
CPC ...... *H01L 29/7926* (2013.01); *H01L 29/66833* (2013.01); *H01L 27/11582* (2013.01); *H01L 21/0262* (2013.01); *H01L 21/02532* (2013.01)
USPC .......................................... 257/65; 257/326

(58) Field of Classification Search
USPC .................................................. 257/65, 326
See application file for complete search history.

(56) References Cited

U.S. PATENT DOCUMENTS

| 2006/0073666 | A1* | 4/2006 | Lim et al. ...................... 438/303 |
| 2009/0184360 | A1* | 7/2009 | Jin et al. ........................ 257/319 |
| 2010/0213537 | A1* | 8/2010 | Fukuzumi et al. ............ 257/326 |
| 2010/0213538 | A1* | 8/2010 | Fukuzumi et al. ............ 257/326 |
| 2011/0233646 | A1  | 9/2011 | Mizushima et al. |

OTHER PUBLICATIONS

Ryota Katsumata, et al., "Pipe-shaped BiCS Flash Memory with 16 Stacked Layers and Multi-Level-Cell Operation for Ultra High Density Storage Devices", 2009 Symposium on VLSI Technology Digest of Technical Papers, 2 pages.

* cited by examiner

*Primary Examiner* — Robert Carpenter
(74) *Attorney, Agent, or Firm* — Oblon, Spivak, McClelland, Maier & Neustadt, L.L.P.

(57) ABSTRACT

A non-volatile semiconductor memory device according to an embodiment includes a semiconductor substrate and a transistor provided on the semiconductor substrate. The transistor includes a conductive layer, a gate insulating layer, a semiconductor layer, and an oxidation layer. The conductive layer functions as a gate of the transistor. The gate insulating layer contacts with a side surface of the conductive layer. The semiconductor layer has a side surface sandwiching the gate insulating layer with the conductive layer, extends a direction perpendicular to the semiconductor substrate, and functions as a body of the transistor. The oxidation layer contacts with the other side surface of the semiconductor layer. The semiconductor layer is made of silicon germanium. The oxidation layer is made of a silicon oxide.

16 Claims, 14 Drawing Sheets a: DEPOSITION OF SiGe (LPCVD)

b: CONCENTRATION OF Ge (THERMAL OXIDATION PROCESS)

NON-VOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2011-205752, filed on Sep. 21, 2011, the entire contents of which are incorporated herein by reference.

FIELD

Embodiments relate to an electrically data-rewritable non-volatile semiconductor memory device and a method of manufacturing the same.

BACKGROUND

In order to improve bit density of a nonvolatile semiconductor memory device such as a NAND-type flash memory, memory cells are expected to be provided in multiple layers. As one of such examples, a stacked NAND-type flash memory in which a memory transistor is made using a vertical transistor has been suggested.

However, in the stacked NAND flash memory according to the related art, channel mobility is not sufficiently high.

DETAILED DESCRIPTION

A non-volatile semiconductor memory device according to an embodiment includes a semiconductor substrate and a transistor provided on the semiconductor substrate. The transistor includes a conductive layer, a gate insulating layer, a semiconductor layer, and an oxidation layer. The conductive layer functions as a gate of the transistor. The gate insulating layer contacts with a side surface of the conductive layer. The semiconductor layer has a side surface sandwiching the gate insulating layer with the conductive layer, extends a direction perpendicular to the semiconductor substrate, and functions as a body of the transistor. The oxidation layer contacts with the other side surface of the semiconductor layer. The semiconductor layer is made of silicon germanium. The oxidation layer is made of a silicon oxide.

Hereinafter, non-volatile semiconductor memory devices according to exemplary embodiments will be described with reference to the accompanying drawings.

First Embodiment

Schematic Structure

Figure 1:
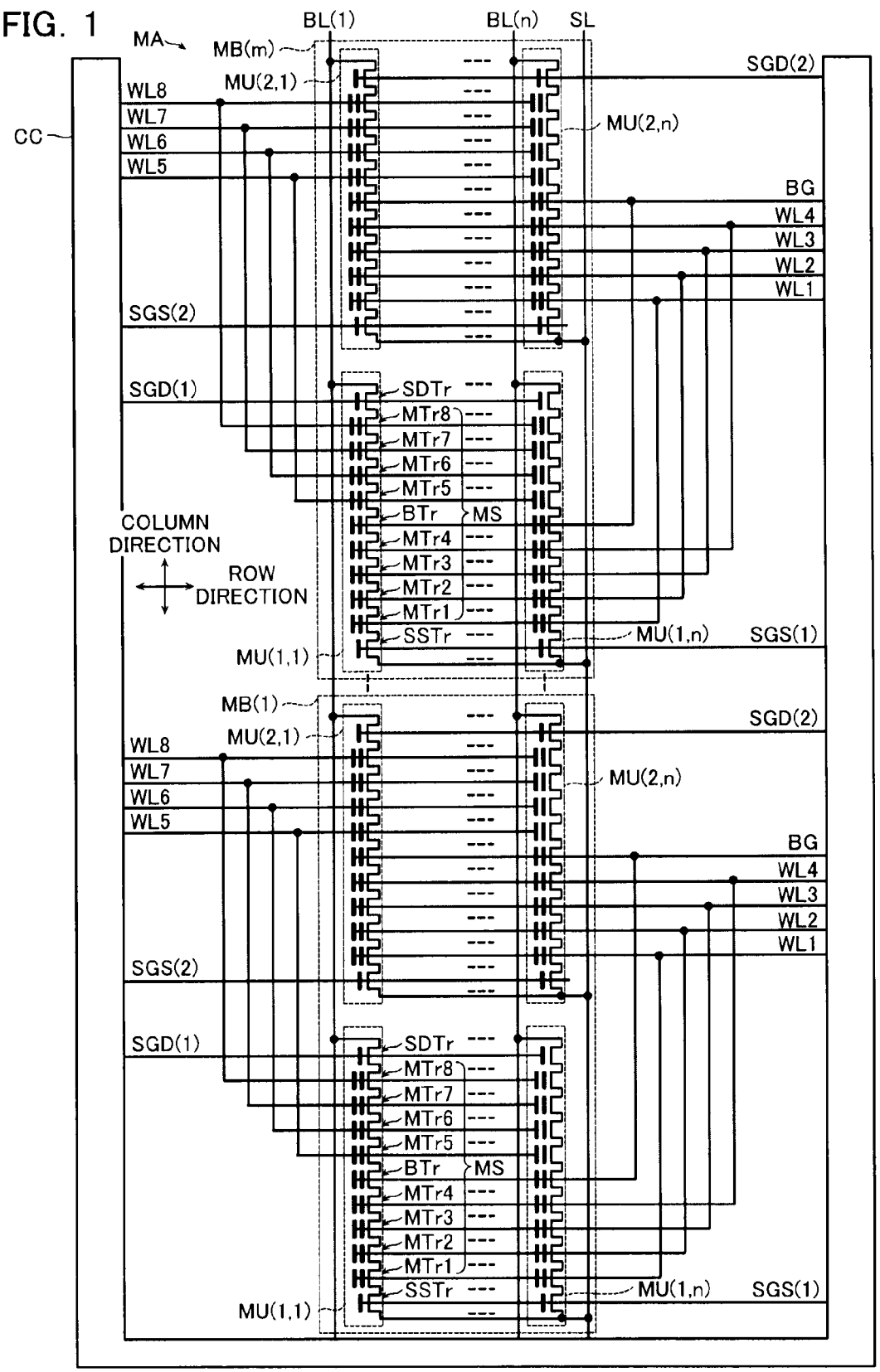
FIG. 1 is a diagram illustrating a memory cell array MA and a peripheral circuit CC of a non-volatile semiconductor memory device according to a first embodiment.

First, the schematic structure of a non-volatile semiconductor memory device according to a first embodiment will be described with reference to FIG. 1. As illustrated in FIG. 1, the non-volatile semiconductor memory device according to the first embodiment includes a memory cell array MA and a peripheral circuit CC. The peripheral circuit CC controls, for example, a voltage applied to memory transistors in the memory cell array MA.

As illustrated in FIG. 1, the memory cell array MA includes m memory blocks MB(1), . . . , MB(m). In the following description, in some cases, all of the memory blocks MB(1), . . . , MB(m) may be generically referred to as memory blocks MB.

Each memory block MB includes memory units MU(1, 1) to MU(2, n) which are arranged in a matrix of n rows and two columns. In this embodiment, the matrix of n rows and two columns is illustrative, and the invention is not limited thereto. In the following description, in some cases, the memory units MU(1, 1) to MU(2, n) may be simply referred to as memory units MU without distinction.

One end of each of the memory units MU(1, 1) to MU(2, n) is connected to corresponding bit lines BL(1) to BL(n) and the other end of the memory units MU(1, 1) to MU(2, n) are connected to a source line SL. The bit lines BL(1) to BL(n) are arranged at predetermined pitches in the row direction and extend in the column direction so as to be laid across a plurality of memory blocks MB. In the following description, in some cases, all of the bit lines BL(1), . . . , BL(n) may be generically referred to as bit lines BL.

The memory unit MU includes a memory string MS, a source-side selection transistor SSTr, and a drain-side selection transistor SDTr.

Figure 2:
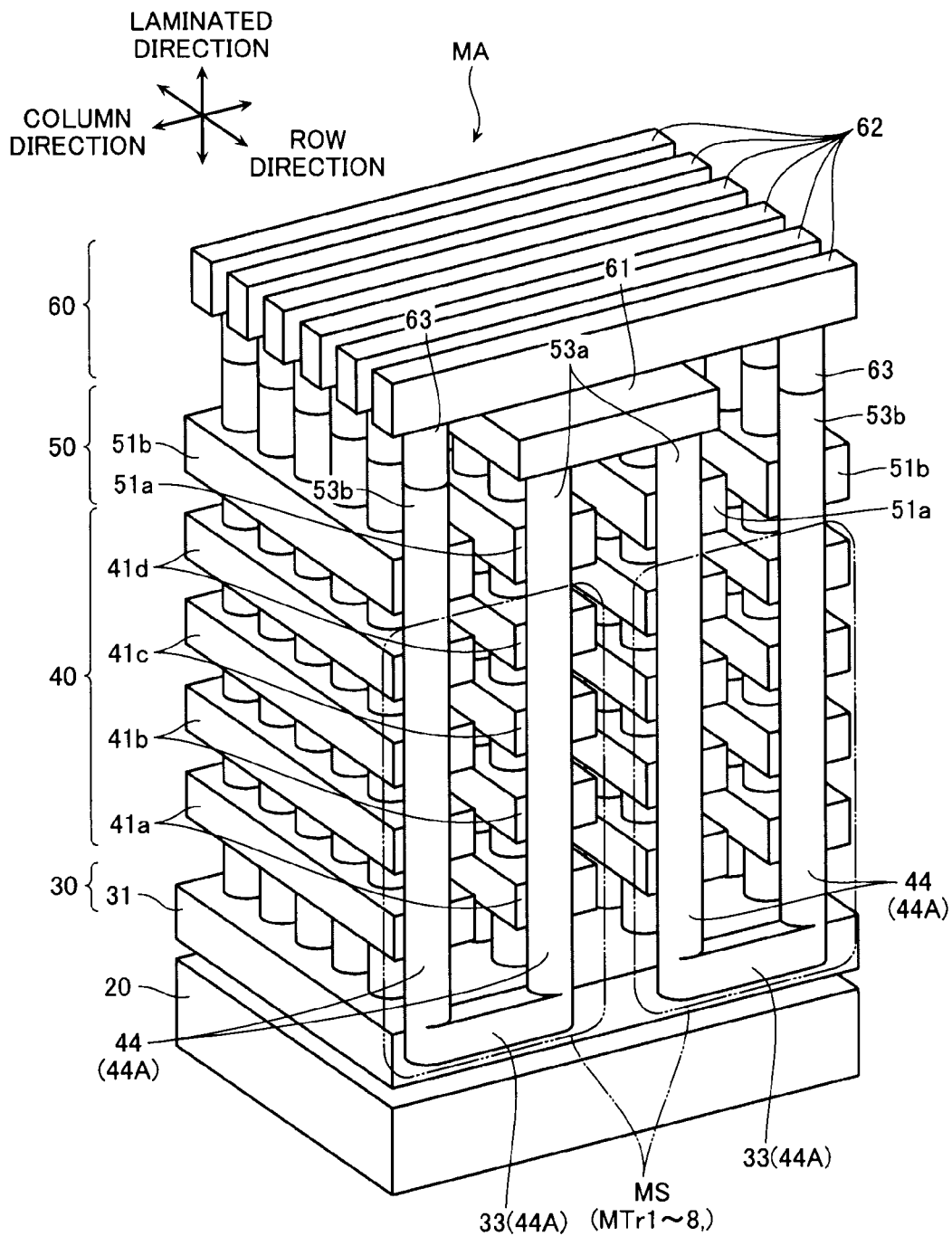
FIG. 2 is a perspective view illustrating the laminated structure of the memory cell array MA according to the first embodiment.

As illustrated in FIG. 1, the memory string MS includes memory transistors MTr1 to MTr8 (memory cells) and a back gate transistor BTr which are connected in series to each other. The memory transistors MTr1 to MTr4 are connected in series to each other and the memory transistors MTr5 to MTr8 are connected in series to each other. The back gate transistor BTr is connected between the memory transistor MTr4 and the memory transistor MTr5. As illustrated in FIG. 2, which will be described below, the memory transistors MTr1 to MTr8 are three-dimensionally arranged in the row direction, the column direction, and a laminated direction (a direction perpendicular to a semiconductor substrate).

The memory transistors MTr1 to MTr8 store charge in their charge storage layers, thereby holding data. The back gate transistor BTr enters conduction state at least when the memory string MS is selected as an operation target.

In the memory blocks MB(1) to MB(m), word lines WL1 to WL8 are commonly connected to the gates of the memory transistor MTr1 to MTr8 which are arranged in a matrix of n rows and two columns. A common back gate line BG is connected to the gates of the back gate transistors BTr which are arranged in a matrix of n rows and two columns.

A drain of the source-side selection transistor SSTr is connected to the source of the memory string MS. A source of the source-side selection transistor SSTr is connected to the source line SL. In each memory block MB, a common source-side selection gate line SGS(1) or SGS(2) is connected to the gates of n source-side selection transistors SSTr which are arranged in a line in the row direction. In the following description, in some cases, the source-side selection gate lines SGS(1) and SGS(2) may be generically referred to source-side selection gate lines SGS without distinction.

A source of the drain-side selection transistor SDTr is connected to the drain of the memory string MS. A drain of the drain-side selection transistor SDTr is connected to the bit line BL. In each memory block MB, a common drain-side selection gate line SGD(1) or SGD(2) is connected to the gates of n drain-side selection transistors SDTr which are arranged in a line in the row direction. In the following description, in some cases, the drain-side selection gate lines SGD(1) and SGD(2) may be generically referred to drain-side selection gate lines SGD without distinction.

[Laminated Structure]

Figure 3:
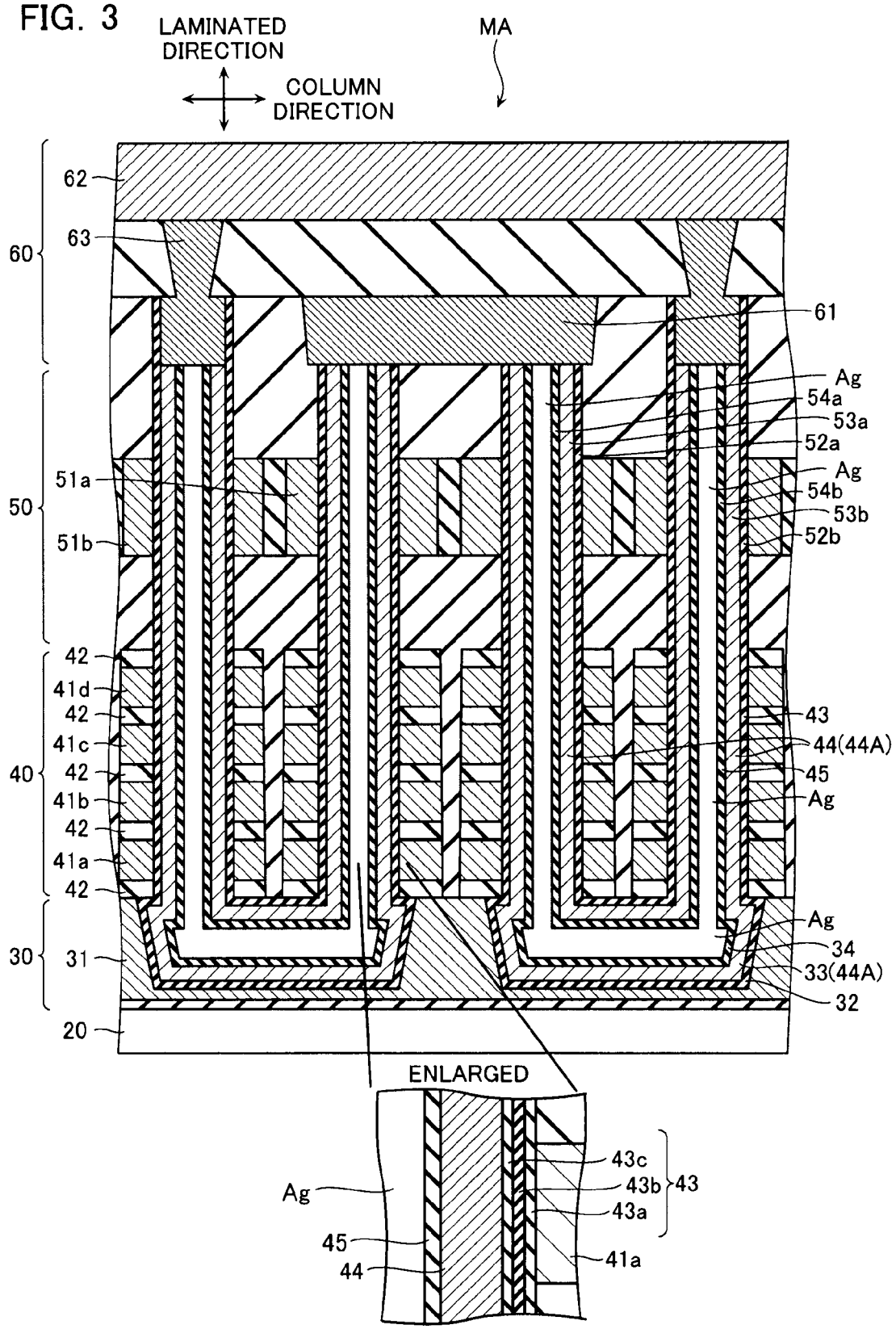
FIG. 3 is a cross-sectional view illustrating the laminated structure of the memory cell array MA according to the first embodiment.

As illustrated in FIGS. 2 and 3, one memory block MB includes a back gate layer 30, a memory layer 40, a selection transistor layer 50, and a wiring layer 60 which are sequentially formed on a semiconductor substrate 20. The back gate layer 30 functions as the back gate transistor BTr. The memory layer 40 functions as the memory transistors MTr1 to MTr8. The selection transistor layer 50 functions as the drain-side selection transistor SDTr and the source-side selection transistor SSTr. The wiring layer 60 functions as the source line SL and the bit line BL.

As illustrated in FIGS. 2 and 3, the back gate layer 30 includes a back gate conductive layer 31. The back gate conductive layer 31 functions as the back gate line BG and the gate of the back gate transistor BTr. The back gate conductive layer 31 two-dimensionally extends in a plate shape in the row direction and the column direction parallel to the semiconductor substrate 20. The back gate conductive layer 31 is made of, for example, polysilicon (poly-Si).

As illustrated in FIG. 3, the back gate layer includes a memory gate insulating layer 32, a semiconductor layer 33, and an oxidation layer 34. The semiconductor layer 33 functions as the body (channel) of the back gate transistor BTr.

The memory gate insulating layer 32 comes into contact with the side surface of the back gate conductive layer 31. The semiconductor layer 33 has one side surface sandwiching the memory gate insulating layer 32 with the back gate conductive layer 31.

The semiconductor layer 33 functions as the body (channel) of the back gate transistor BTr. The semiconductor layer 33 has a hollow Ag. The semiconductor layer 33 is formed so as be buried in the back gate conductive layer 31. The semiconductor layer 33 is formed in a substantially rectangular shape having the column direction as the longitudinal direction, as viewed from the upper side. The semiconductor layers 33 are formed in a matrix in the row direction and the column direction in one memory block MB. The semiconductor layer 33 is made of silicon germanium (SiGe). The concentration of germanium in the semiconductor layer 33 is equal to or more than 30% and more preferably equal to or more than 70%.

One side surface of the oxidation layer 34 comes into contact with the other side surface of the semiconductor layer 33. The oxidation layer 34 has a hollow Ag. The oxidation layer 34 is formed by oxidizing silicon included in the semiconductor layer 33 (memory semiconductor layer 44A) as in a manufacturing process, which will be described below. That is, the oxidation layer 34 is made of a silicon oxide ($SiO_2$).

In other words, in the structure of the back gate layer 30, the back gate conductive layer 31 surrounds the side surface and the lower surface of the semiconductor layer 33 via the memory gate insulating layer 32.

As illustrated in FIGS. 2 and 3, the memory layer 40 is formed on the back gate layer 30. The memory layer 40 includes four word line conductive layers 41a to 41d. The word line conductive layer 41a functions as the word line WL4 and the gate of the memory transistor MTr4. In addition, the word line conductive layer 41a functions as the word line WL5 and the gate of the memory transistor MTr5. Similarly, the word line conductive layers 41b to 41d function as the word lines WL1 to WL3 and the gates of the memory transistors MTr1 to MTr3, respectively. In addition, the word line conductive layers 41b to 41d function as the word lines WL6 to WL8 and the gates of the memory transistors MTr6 to MTr8, respectively.

The word line conductive layers 41a to 41d are laminated via interlayer insulating layers 42 in the vertical direction. The word line conductive layers 41a to 41d are arranged at predetermined pitches in the column direction and extend in the row direction (direction perpendicular to the plane of FIG. 3) as the longitudinal direction. The word line conductive layers 41a to 41d are made of, for example, polysilicon (poly-Si).

As illustrated in FIG. 3, the memory layer 40 includes a memory gate insulating layer 43, a columnar semiconductor layer 44, and an oxidation layer 45. The columnar semiconductor layer 44 functions as the bodies (channel) of the memory transistors MTr1 to MTr8.

The memory gate insulating layer 43 comes into contact with the side surfaces of the word line conductive layers 41a to 41d. The memory gate insulating layer 43 is continuous with the memory gate insulating layer 32 and is formed integrally therewith. The memory gate insulating layer 43 includes a block insulating layer 43a, a charge storage layer 43b, and a tunnel insulating layer 43c which are arranged in this order from the side surfaces of the word line conductive layers 41a to 41d to the columnar semiconductor layer 44. The charge storage layer 43b is configured so as to store charge.

The block insulating layer 43a is formed with a predetermined thickness on the side surfaces of the word line conductive layers 41a to 41d. The charge storage layer 43b is formed with a predetermined thickness on a side surface of the block insulating layer 43a. The tunnel insulating layer 43c is formed with a predetermined thickness on a side surface of the charge storage layer 43b. The block insulating layer 43a and the tunnel insulating layer 43c are made of a silicon oxide ($SiO_2$). The charge storage layer 43b is made of a silicon nitride (SiN).

one side surface of the columnar semiconductor layer 44 sandwiches the memory gate insulating layer 43 with the word line conductive layers 41a to 41d. The columnar semiconductor layer 44 has a hollow Ag. The columnar semiconductor layer 44 penetrates through the word line conductive layers 41a to 41d and interlayer insulating layers 42. The columnar semiconductor layer 44 extends in the direction perpendicular to the semiconductor substrate 20. A pair of columnar semiconductor layers 44 are continuous with the semiconductor layer 33 and are formed integrally therewith. The pair of columnar semiconductor layers 44 are matched with each other in the vicinity of the end of the semiconductor layer 33 in the column direction. The columnar semiconductor layer 44 is made of silicon germanium (SiGe). The concentration of germanium in the columnar semiconductor layer 44 is equal to or more than 30% and more preferably equal to or more than 70%.

One side surface of the oxidation layer 45 comes into contact with the other side surface of the columnar semiconductor layer 44. The oxidation layer 45 has a hollow Ag. The oxidation layer 45 is continuous with the oxidation layer 34 and is formed integrally therewith. The oxidation layer 45 is formed by oxidizing silicon included in the columnar semiconductor layer 44 (memory semiconductor layer 44A) as in the manufacturing process, which will be described below. That is, the oxidation layer 45 is made of a silicon oxide ($SiO_2$).

In the back gate layer 30 and the memory layer 40, the pair of columnar semiconductor layers 44 and the semiconductor layer 33 connecting the lower ends of columnar semiconductor layers 44 constitute the memory semiconductor layer 44A functioning as the body (channel) of the memory string MS. The memory semiconductor layer 44A has a U shape, as viewed from the row direction.

In other words, in the structure of the memory layer 40, the word line conductive layers 41a to 41d surround the columnar semiconductor layers 44 via the memory gate insulating layer 43.

As illustrated in FIGS. 2 and 3, the selection transistor layer 50 includes a source-side conductive layer 51a and a drain-side conductive layer 51b. The source-side conductive layer 51a functions as the source-side selection gate line SGS and the gate of the source-side selection transistor SSTr. The drain-side conductive layer 51b functions as the drain-side selection gate line SGD and the gate of the drain-side selection transistor SDTr.

The source-side conductive layer 51a is formed above one of the columnar semiconductor layers 44 forming the memory semiconductor layer 44A. The drain-side conductive layer 51b is the same layer as the source-side conductive layer 51a and is formed on the other one of the columnar semiconductor layers 44 forming the memory semiconductor layer 44A. A plurality of source-side conductive layers 51a and drain-side conductive layers 51b are arranged at predetermined pitches in the column direction and extend in the row direction. The source-side conductive layer 51a and the drain-side conductive layer 51b are made of, for example, polysilicon (poly-Si).

As illustrated in FIG. 3, the selection transistor layer 50 includes a source-side gate insulating layer 52a, a source-side columnar semiconductor layer 53a, an oxidation layer 54a, a drain-side gate insulating layer 52b, a drain-side columnar semiconductor layer 53b, and an oxidation layer 54b. The source-side columnar semiconductor layer 53a functions as a body (channel) of the source-side selection transistor SSTr. The drain-side columnar semiconductor layer 53b functions as a body (channel) of the drain-side selection transistor SDTr.

The source-side gate insulating layer 52a comes into contact with the side surface of the source-side conductive layer 51a. The source-side gate insulating layer 52a is made of, for example, a silicon oxide ($SiO_2$).

The source-side columnar semiconductor layer 53a sandwiches the source-side gate insulating layer 52a with the source-side conductive layer 51a. The source-side columnar semiconductor layer 53a penetrates through the source-side conductive layer 51a. The source-side columnar semiconductor layer 53a is connected to an upper surface of one of the pair of columnar semiconductor layers 44 and has a columnar shape extending in the direction perpendicular to the semiconductor substrate 20. In addition, the source-side columnar semiconductor layer 53a has a hollow Ag. The source-side columnar semiconductor layer 53a is made of silicon germanium (SiGe). The concentration of germanium in the source-side columnar semiconductor layer 53a is equal to or more than 30% and more preferably equal to or less than 70%.

One side surface of the oxidation layer 54a comes into contact with the other side surface of the source-side columnar semiconductor layer 53a. The oxidation layer 54a has a hollow Ag. The oxidation layer 54a is formed by oxidizing silicon in the source-side columnar semiconductor layer 53a. That is, the oxidation layer 54a is made of a silicon oxide ($SiO_2$).

The drain-side gate insulating layer 52b comes into contact with the side surface of the drain-side conductive layer 51b. The drain-side gate insulating layer 52b is made of, for example, a silicon oxide ($SiO_2$).

The drain-side columnar semiconductor layer 53b sandwiches the drain-side gate insulating layer 52b with the drain-side conductive layer 51b. The drain-side columnar semiconductor layer 53b penetrates through the drain-side conductive layer 51b. The drain-side columnar semiconductor layer 53b is connected to an upper surface of one of the pair of columnar semiconductor layers 44 and has a columnar shape extending in the direction perpendicular to the semiconductor substrate 20. In addition, the drain-side columnar semiconductor layer 53b has a hollow Ag. The drain-side columnar semiconductor layer 53b is made of silicon germanium (SiGe). The concentration of germanium in the drain-side columnar semiconductor layer 53b is equal to or more than 30% and more preferably equal to or less than 70%.

One side surface of the oxidation layer 54b comes into contact with the other side surface of the drain-side columnar semiconductor layer 53b. The oxidation layer 54b has a hollow Ag. The oxidation layer 54b is formed by oxidizing silicon in the drain-side columnar semiconductor layer 53b. That is, the oxidation layer 54b is made of a silicon oxide ($SiO_2$).

In other words, in the structure of the selection transistor layer 50, the source-side conductive layer 51a surrounds the side surface of the source-side columnar semiconductor layer 53a via the source-side gate insulating layer 52a. The drain-side conductive layer 51b surrounds the side surface of the drain-side columnar semiconductor layer 53b via the drain-side gate insulating layer 52b.

The wiring layer 60 includes a source line layer 61, a bit line layer 62, and a plug layer 63. The source line layer 61 functions as the source line SL. The bit line layer 62 functions as the bit line BL.

The source line layer 61 comes into contact with an upper surface of the source-side columnar semiconductor layer 53a and extends in the row direction. The bit line layer 62 comes into contact with an upper surface of the drain-side columnar semiconductor layer 53b through the plug layer 63 and extends in the column direction. The source line layer 61, the bit line layer 62, and the plug layer 63 are made of a metal material, such as tungsten, for example.

As described above, in the first embodiment, the body of the memory transistor MTr is formed by the memory columnar semiconductor layer 44A made of silicon germanium. Therefore, in the first embodiment, it is possible to improve channel mobility, as compared to the structure in which the body of the memory transistor MTr is made of polysilicon (amorphous silicon).

In the first embodiment, the body of the source-side selection transistor SSTr is formed by the source-side columnar semiconductor layer 53a made of silicon germanium. Therefore, in the first embodiment, it is possible to improve channel mobility, as compared to the structure in which the body of the source-side selection transistor SSTr is made of polysilicon (amorphous silicon).

In the first embodiment, the body of the drain-side selection transistor SDTr is formed by the source-side columnar semiconductor layer 53b made of silicon germanium. Therefore, in the first embodiment, it is possible to improve channel mobility, as compared to the structure in which the body of the drain-side selection transistor SDTr is made of polysilicon (amorphous silicon).

[Method of Manufacturing Memory Semiconductor Layer 44A and Oxidation Layer 45]

Next, a method of manufacturing the memory semiconductor layer 44A and the oxidation layer 45 will be described with reference to FIG. 4.

Figure 4:
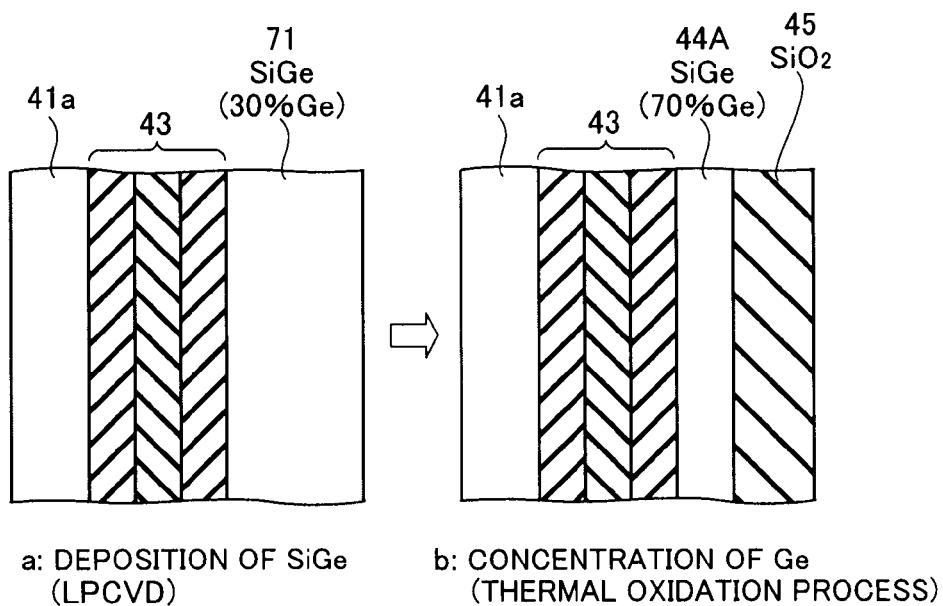
FIG. 4 is enlarged cross-sectional views illustrating a process of manufacturing a memory semiconductor layer 44A and an oxidation layer 45 according to the first embodiment.

As illustrated in "a" of FIG. 4, first, a silicon germanium layer 71 (SiGe) is formed on the side surface of the memory gate insulating layer 43 by an LPCVD process. In order to maintain the flatness of the silicon germanium layer 71, the concentration of germanium in the silicon germanium layer 71 is set to be less than 30%. For example, the thickness of the silicon germanium layer 71 is set to 10 nm.

A process of manufacturing the silicon germanium layer 71 illustrated in "a" of FIG. 4 includes a first process of depositing silicon and a second process of depositing silicon germanium on the silicon. The first process is performed under the conditions of 410° C., 160 Torr, and $H_2/Si_2H_6$=20/0.05 slm. The second process is performed under the conditions of 410° C., 160 Torr, and $H_2/Si_2H_6/GeH_4$=20/0.05/0.006 slm.

Then, as illustrated in "b" of FIG. 4, a thermal oxidation process is performed to apply heat such that only silicon in the silicon germanium layer 71 is oxidized, thereby forming the oxidation layer 45 ($SiO_2$). Then, germanium in the silicon germanium layer 71 is concentrated and the memory semiconductor layer 44A (the concentration of germanium is equal to or more than 30%) is formed. The thermal oxidation process is performed at a temperature capable of selectively oxidizing only silicon. For example, a thickness of 5 nm of the silicon germanium layer 71 is oxidized and the oxidation layer 45 with a thickness of 11.4 nm is formed.

The thermal oxidation process illustrated in "b" of FIG. 4 is performed under the conditions of 1035° C. to 1085° C., 760 Torr, and $O_2$=5 slm. The temperature of the thermal oxidation process may be reduced over time. In this way, the temperature of the silicon germanium layer 71 is reduced over time and it is possible to reduce the number of defects in a silicon germanium crystal.

Subsequent to "b" of FIG. 4, annealing may be performed at a temperature equal to or more than the melting point of silicon germanium to melt and solidify the memory semiconductor layer 44A (silicon germanium). In this way, it is possible to increase the diameter of silicon germanium or germanium grains.

Figure 5:
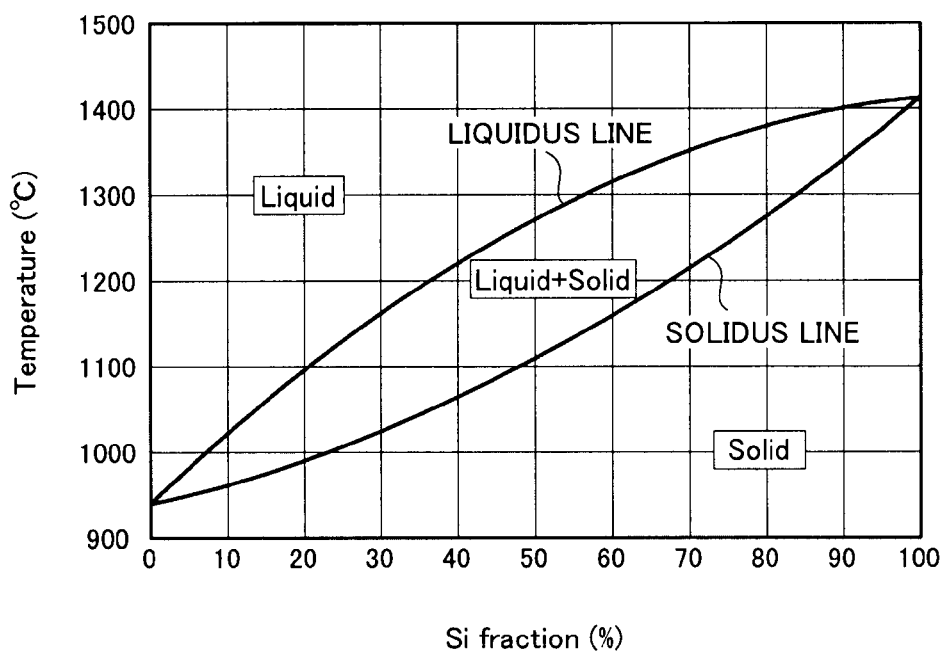
FIG. 5 is a phase diagram illustrating the solid-liquid phase equilibrium of silicon germanium.

The temperature equal to or more than the melting point of silicon germanium is a temperate above a solidus line in a phase diagram of FIG. 5 illustrating the solid-liquid phase equilibrium of silicon germanium. For example, when the concentration of germanium is 50%, the temperature equal to or more than the melting point of silicon germanium is equal to or more than 1100° C.

In addition, a manufacturing method of depositing silicon germanium using a sputtering method is considered other than the manufacturing method according to this embodiment. However, in this manufacturing method, it is difficult to form silicon germanium extending in the laminated direction. In addition, a manufacturing method is considered which deposits a high concentration of silicon germanium (the concentration of germanium is equal to or more than 30%) using an LPCVD method, without performing a thermal oxidation process. However, in this manufacturing method, the surface roughness of silicon germanium increases. In order to solve this problem, the first embodiment can form the memory semiconductor layer 44A extending in the laminated direction using the process illustrated in FIG. 4. Then, the first embodiment can reduce the surface roughness (form a film with a uniform thickness) and form the memory semiconductor layer 44A with a high concentration of silicon germanium. The memory semiconductor layer 44A is formed such that the concentration of germanium is equal to or more than 30% and more preferably equal to or more than 70%. In this case, it is possible to further improve the effect.

In this embodiment, the manufacturing process illustrated in FIG. 4 is also applied to form the source-side columnar semiconductor layer 53a and the drain-side columnar semiconductor layer 53b.

Figure 6:
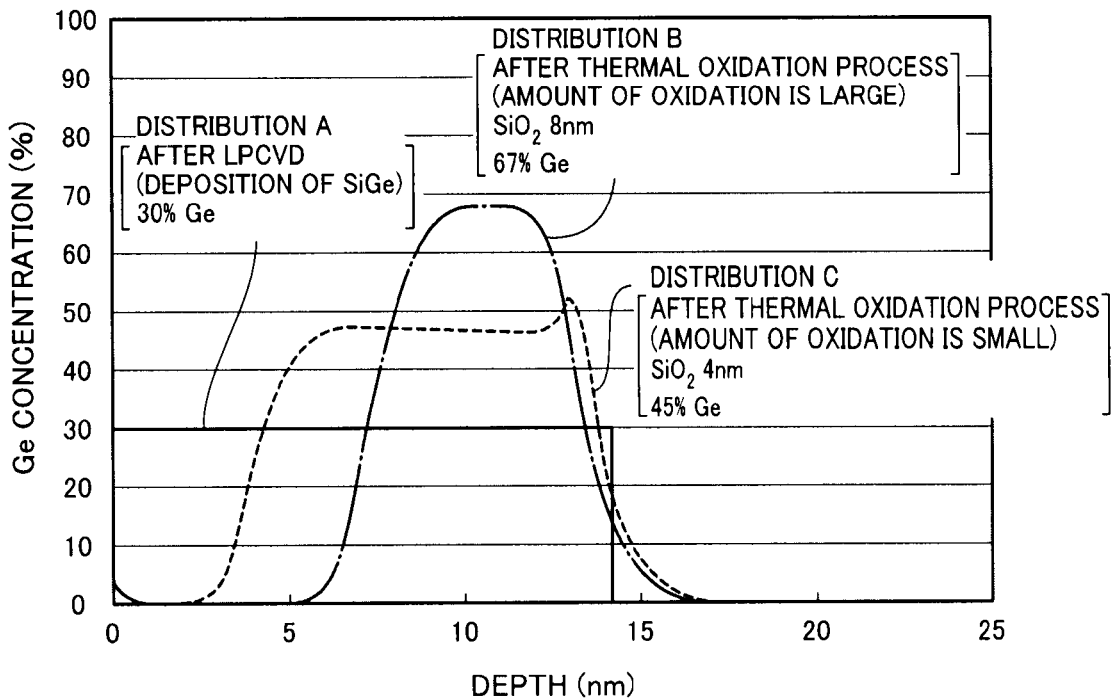
FIG. 6 is a diagram illustrating the distribution of germanium concentration in a depth direction.

FIG. 6 is a diagram illustrating the distribution of germanium concentration in the depth direction when the manufacturing process according to this embodiment is performed. In the example illustrated in FIG. 6, the silicon germanium layer 71 includes 30% of germanium and is formed with a thickness of about 18 nm (distribution A). The silicon germanium layer 71 illustrated in FIG. 6 is formed under the same conditions as those in "a" of FIG. 4.

A thermal oxidation process is performed on the silicon germanium layer 71 to adjust the amount of oxidation of the silicon germanium layer 71. In this way, as illustrated in FIG. 6, the concentration of germanium is changed from the distribution A to a distribution B or a distribution C. In the distribution B, the amount of oxidation of silicon germanium is more than that in the distribution C. In the distribution B, the thickness of the oxidation layer 45 ($SiO_2$) is 4 nm and the concentration of germanium in the memory semiconductor layer 44A (SiGe) is 45%. In the distribution C, the thickness of the oxidation layer 45 ($SiO_2$) is 8 nm and the concentration of germanium in the memory semiconductor layer 44A (SiGe) is 67%. As shown in the distribution B of FIG. 6, the concentration of germanium increases gradually as the depth increases from around 5 nm, and has a peak in the vicinity of a depth of 10 nm. In addition, the concentration of germanium decreases gradually as the depth increases from the peak and is zero in the vicinity of a depth of 17 nm. That is, the concentration of germanium in the memory semiconductor layer 44A increases gradually from the oxidation layer 45 to the memory gate insulating layer 43 and has a peak. In addition, the concentration of germanium in the memory semiconductor layer 44A decreases gradually from the peak to the memory gate insulating layer 43. In the distribution B illustrated in FIG. 6, a silicon oxide ($SiO_2$) is mainly present in a region from the surface to a depth of 5 nm and silicon (Si) is mainly present in a region from a depth of 17 nm. The conditions of the thermal oxidation process illustrated in FIG. 6 are the same as those described with reference to "b" of FIG. 4.

Figure 7:
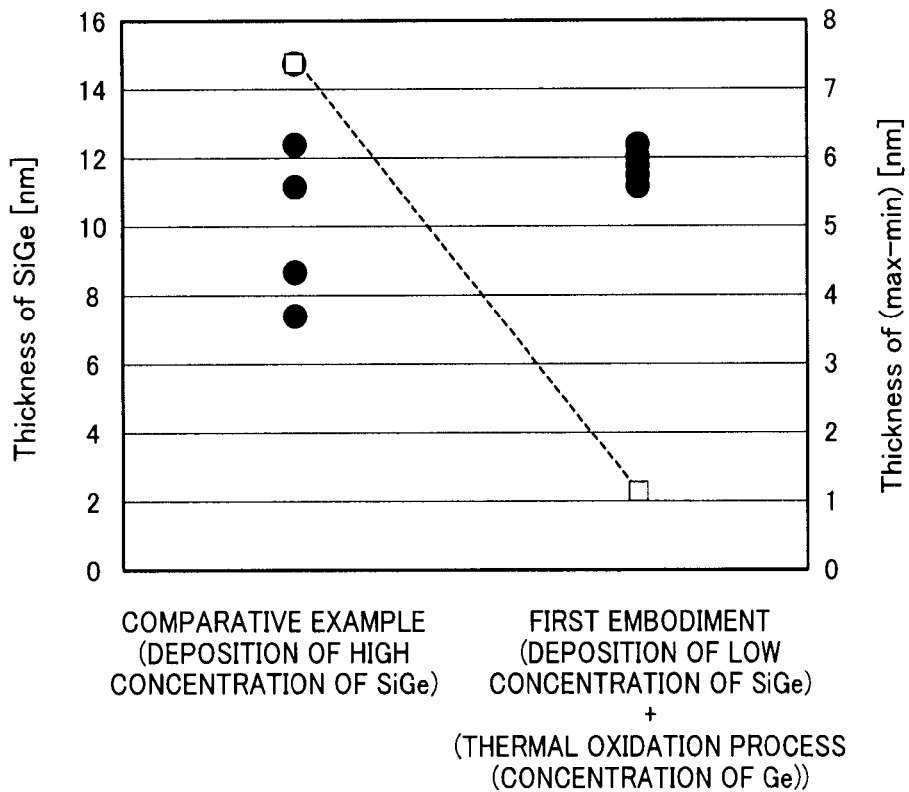
FIG. 7 is a diagram illustrating the thicknesses of silicon germanium formed by manufacturing methods according to the first embodiment and a comparative example.

Next, the manufacturing method according to this embodiment is compared with that according to a comparative example with reference to FIG. 7. In the manufacturing method according to the comparative example, a high concentration of silicon germanium (the concentration of germanium is equal to or more than 30%) is deposited by an LPCVD method to form the memory semiconductor layer 44A, without performing a thermal oxidation process. The manufacturing method according to the comparative example includes a first process of depositing silicon and a second process of depositing germanium on the silicon. The first process according to the comparative example is performed under the conditions of 410° C., 160 Torr, and $H_2/Si_2H_6=20/0.05$ sml. The second process is performed under the conditions of 300° C., 160 Torr, $H_2/GeH_4=6/0.01$ sml. In FIG. 7, a black circle indicates the thickness of the memory semiconductor layer 44A (silicon germanium) measured on the basis of a cross-section image. In FIG. 7, a white rectangle indicates the difference between the maximum value and the minimum value of the measured thickness of the layer.

As illustrated in FIG. 7, in the manufacturing method according to the first embodiment, it is possible to form the memory semiconductor layer 44A (silicon germanium) with a uniform thickness, as compared to the manufacturing method according to the comparative example.

[Method of Manufacturing Non-Volatile Semiconductor Memory Device]

Next, a method of manufacturing the non-volatile semiconductor memory device according to the first embodiment will be described with reference to FIGS. 8 to 16.

Figure 8:
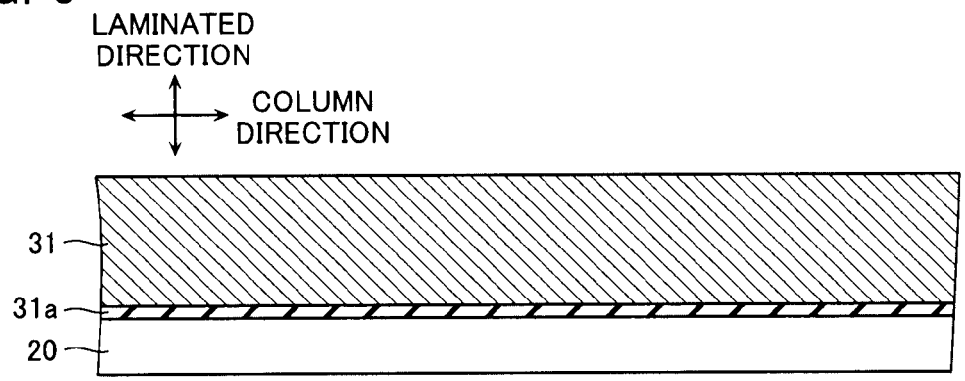
FIG. 8 is a cross-sectional view illustrating a process of manufacturing the non-volatile semiconductor memory device according to the first embodiment.

First, as illustrated in FIG. 8, the insulating layer 31a and the back gate conductive layer 31 are deposited on the semiconductor substrate 20 by, for example, CVD.

Figure 9:
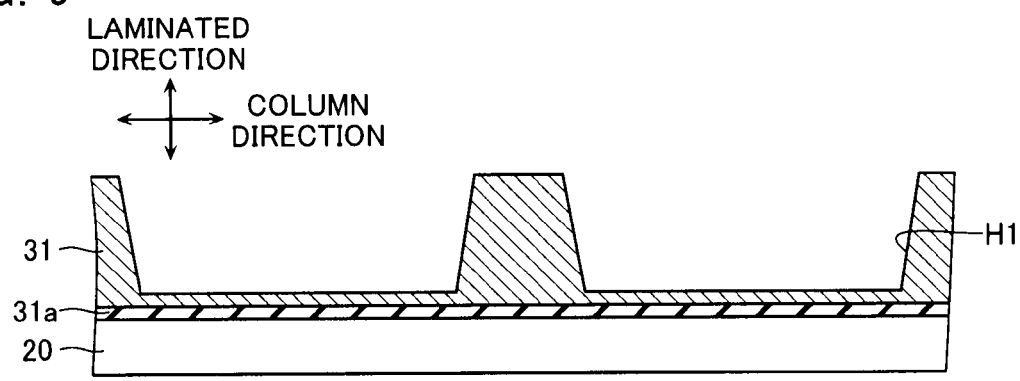
FIG. 9 is a cross-sectional view illustrating the process of manufacturing the non-volatile semiconductor memory device according to the first embodiment.

Then, as illustrated in FIG. 9, the back gate conductive layer 31 is etched to form back gate holes H1. The back gate holes H1 are arranged in a matrix in the column direction and the row direction. The back gate hole H1 has a rectangular shape having the column direction as the longitudinal direction, as viewed from the upper side.

Figure 10:
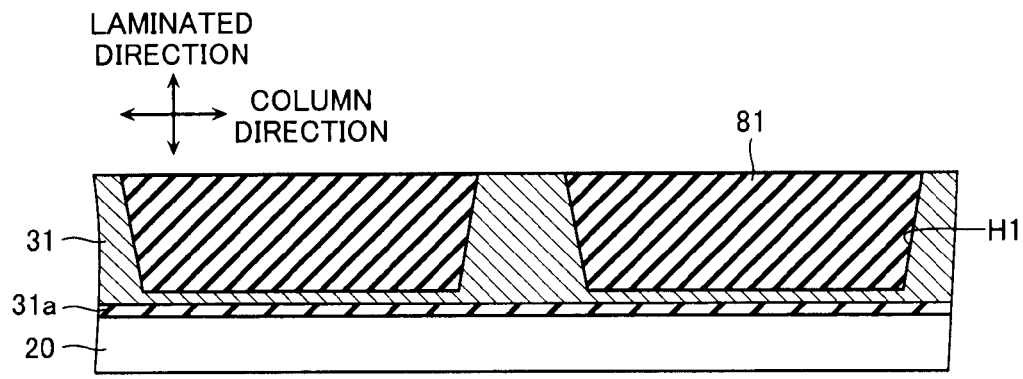
FIG. 10 is a cross-sectional view illustrating the process of manufacturing the non-volatile semiconductor memory device according to the first embodiment.
Figure 11:
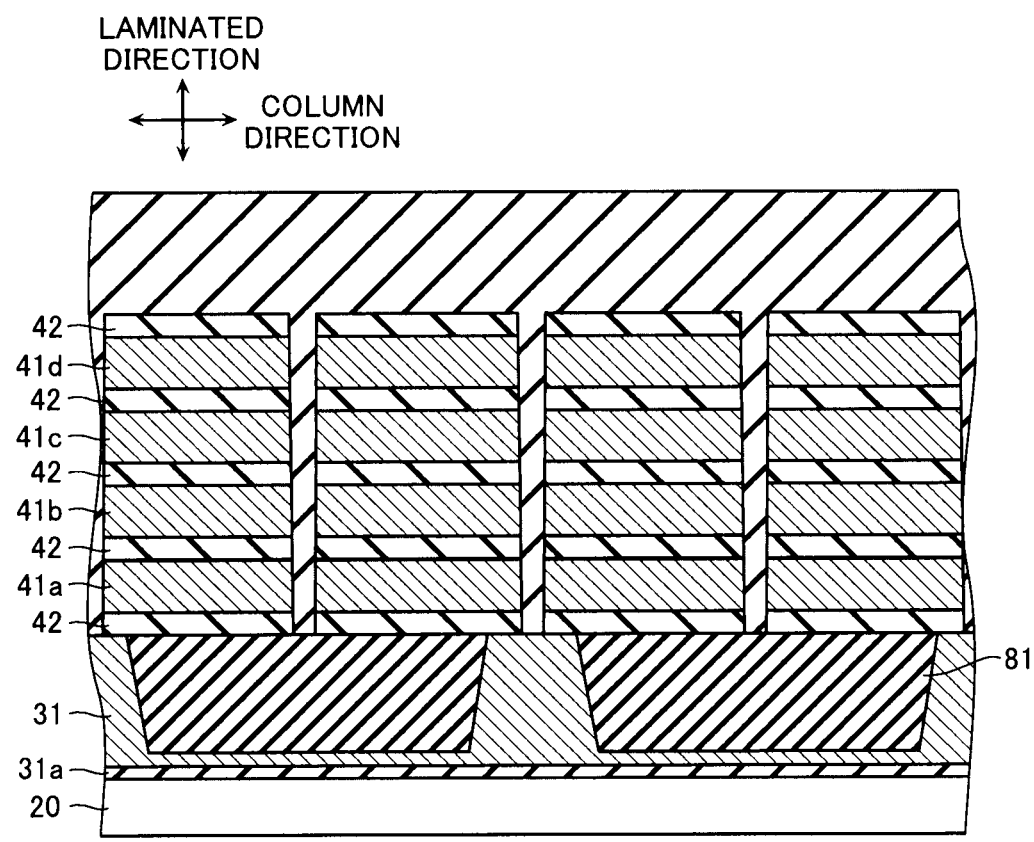
FIG. 11 is a cross-sectional view illustrating the process of manufacturing the non-volatile semiconductor memory device according to the first embodiment.

Then, as illustrated in FIG. 10, a sacrifice layer 81 is formed so as to fill the back gate holes H1. Then, as illustrated in FIG. 11, the word line conductive layers 41a to 41d are deposited via the insulating layers 42 and are then processed the word line conductive layers 41a to 41d and the insulating layers 42 in a predetermined pattern.

Figure 12:
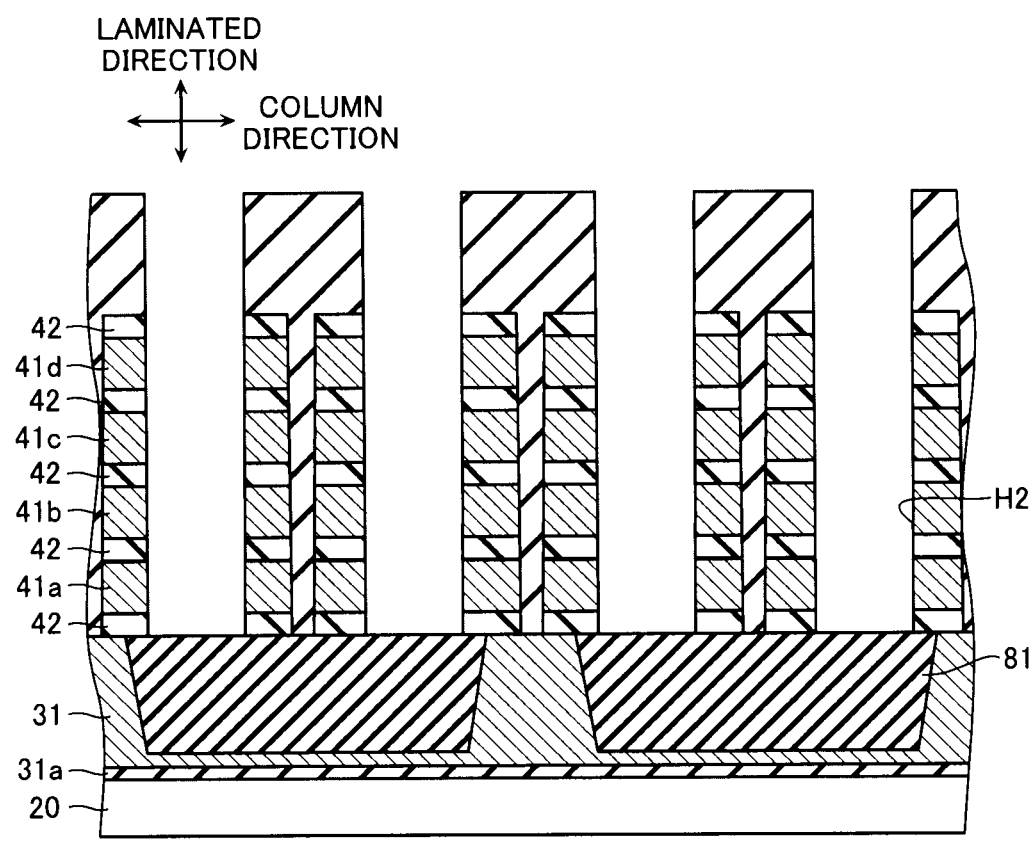
FIG. 12 is a cross-sectional view illustrating the process of manufacturing the non-volatile semiconductor memory device according to the first embodiment.

Then, as illustrated in FIG. 12, the insulating layers 42 and the word line conductive layers 41a to 41d are etched and memory holes H2 penetrating through the insulating layers 42 and the word line conductive layers 41a to 41d are formed. The memory holes H2 are formed so as to be matched with the ends of the sacrifice layer 81 in the column direction.

Figure 13:
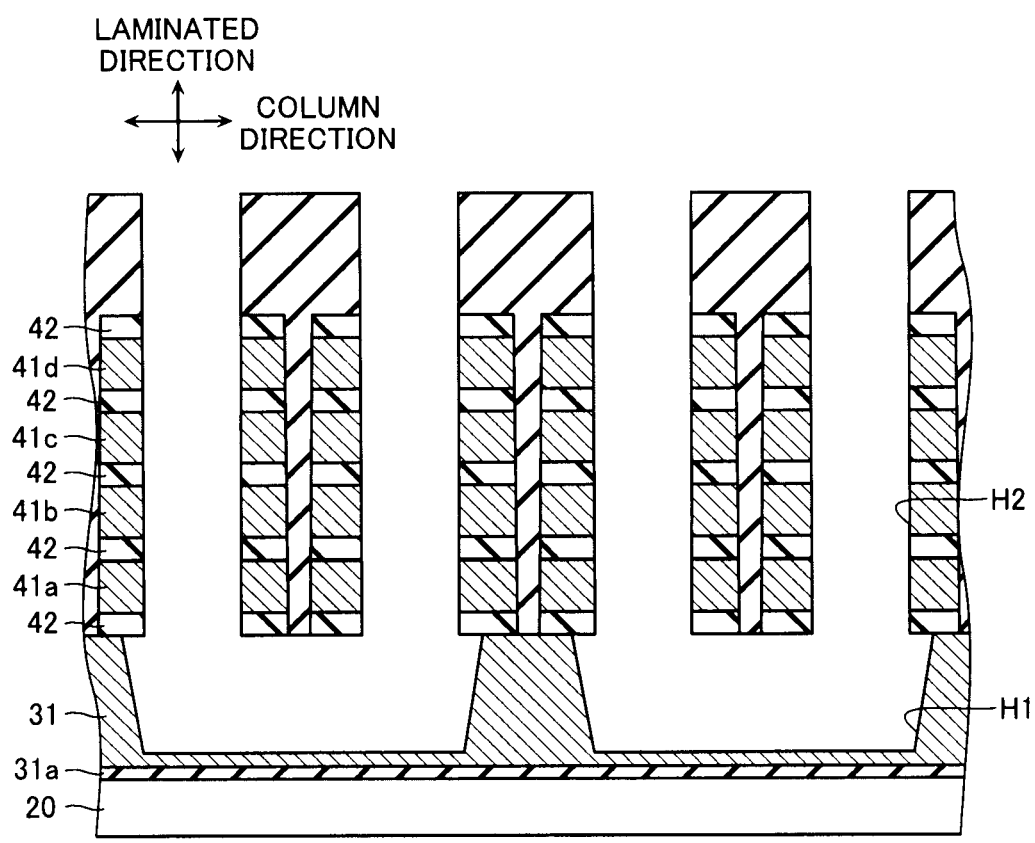
FIG. 13 is a cross-sectional view illustrating the process of manufacturing the non-volatile semiconductor memory device according to the first embodiment.

Then, as illustrated in FIG. 13, the sacrifice layer 81 is selectively removed through the memory holes H2 by, for example, wet etching.

Figure 14:
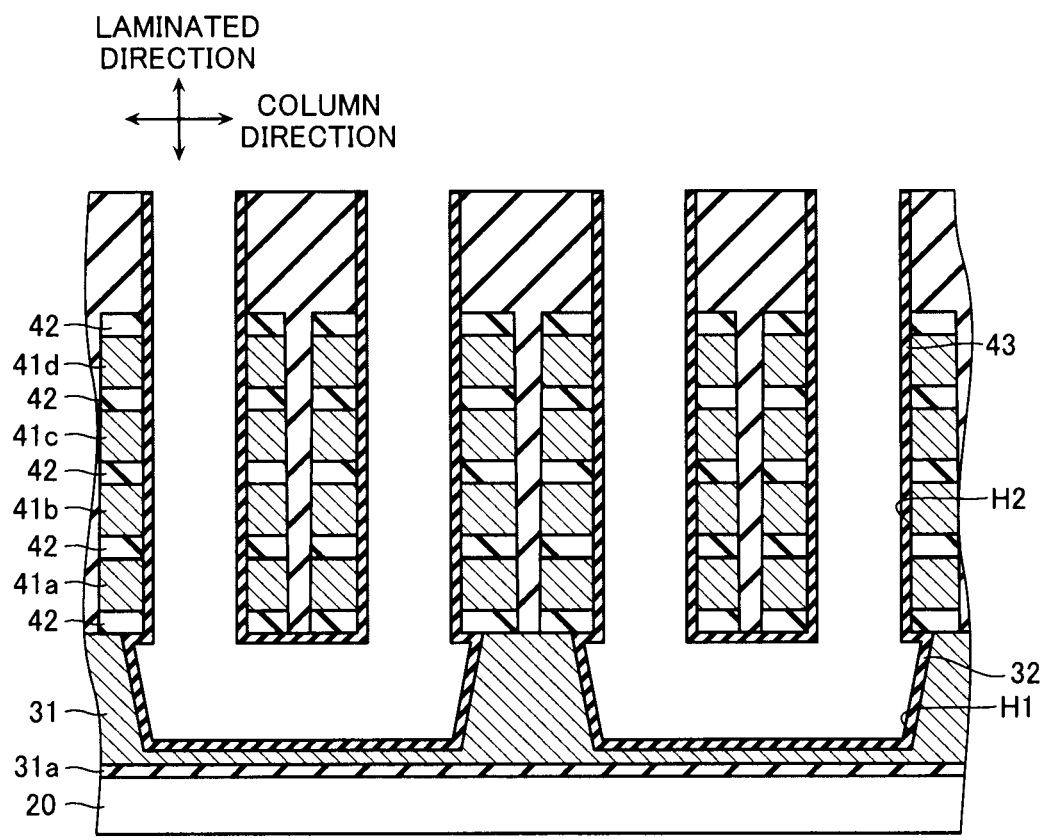
FIG. 14 is a cross-sectional view illustrating the process of manufacturing the non-volatile semiconductor memory device according to the first embodiment.
Figure 15:
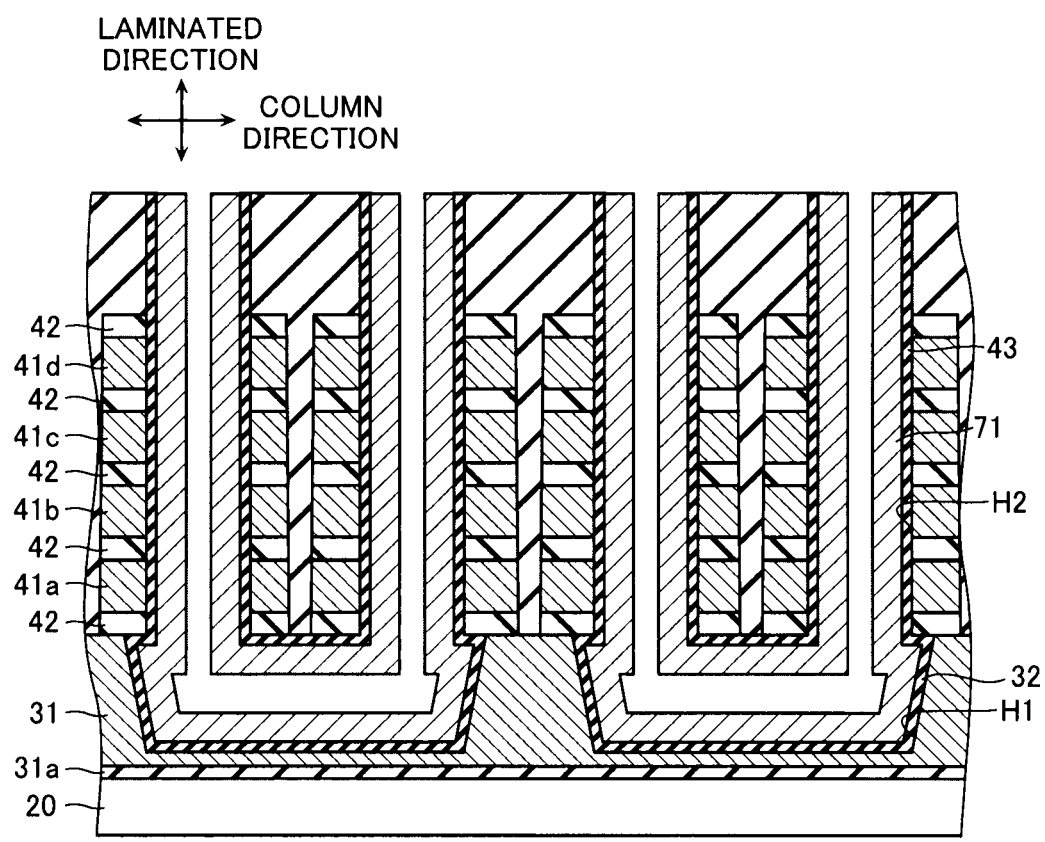
FIG. 15 is a cross-sectional view illustrating the process of manufacturing the non-volatile semiconductor memory device according to the first embodiment.
Figure 16:
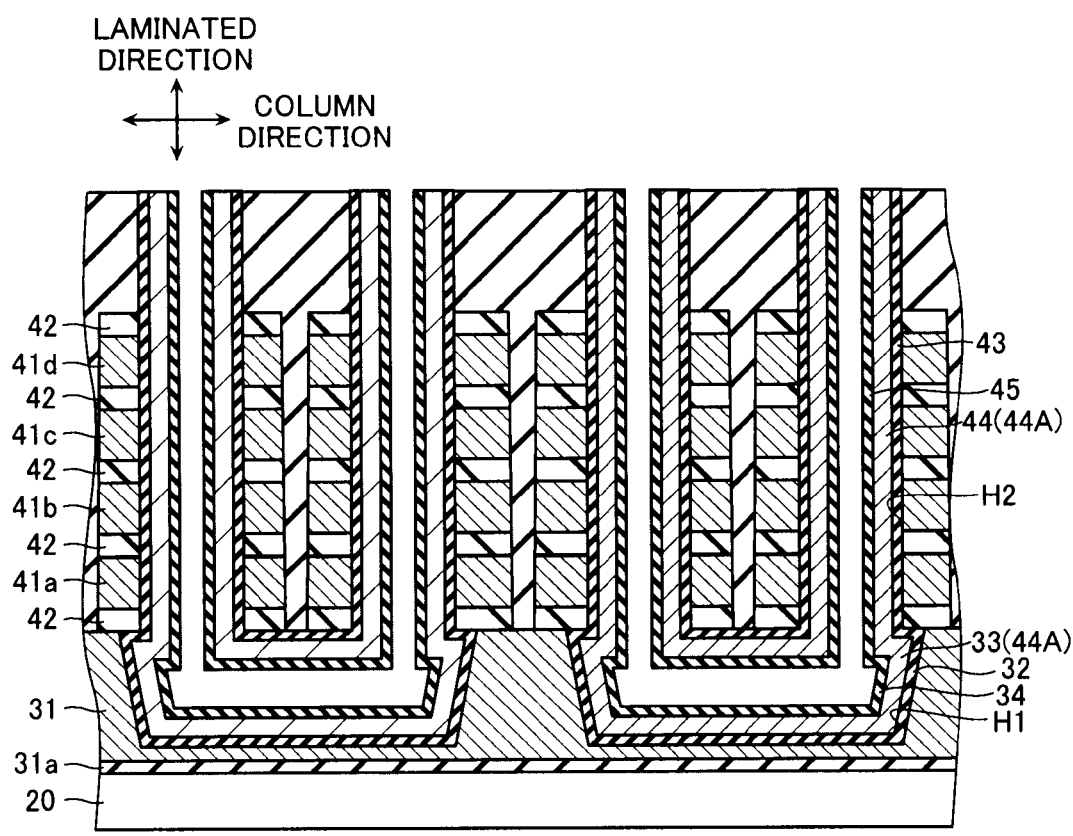
FIG. 16 is a cross-sectional view illustrating the process of manufacturing the non-volatile semiconductor memory device according to the first embodiment.

Then, as illustrated in FIG. 14, the memory gate insulating layers 32 and 43 are formed on the side surfaces of the back gate holes H1 and the memory holes H2 by CVD. Then, as illustrated in FIG. 15, the silicon germanium layer 71 is formed on the side surfaces of the memory gate insulating layers 32 and 43 by the same process as that in "a" of FIG. 4. Then, as illustrated in FIG. 16, the silicon germanium layer 71 is oxidized by the same process as that in "b" of FIG. 4 to form the memory semiconductor layer 44A and the oxidation layers 34 and 45. In this way, the back gate layer 30 and the memory layer 40 are formed by the processes illustrated in FIGS. 8 to 16. After the process illustrated in FIG. 16, the selection transistor layer 50 and the wiring layer 60 are formed on the memory layer 40. In this way, the non-volatile semiconductor memory device according to the first embodiment is manufactured.

Second Embodiment

Next, a non-volatile semiconductor memory device according to a second embodiment will be described with reference to FIG. 17. In the second embodiment, the same components as those in the first embodiment are denoted by the same reference numerals and the description thereof will not be repeated.

Figure 17:
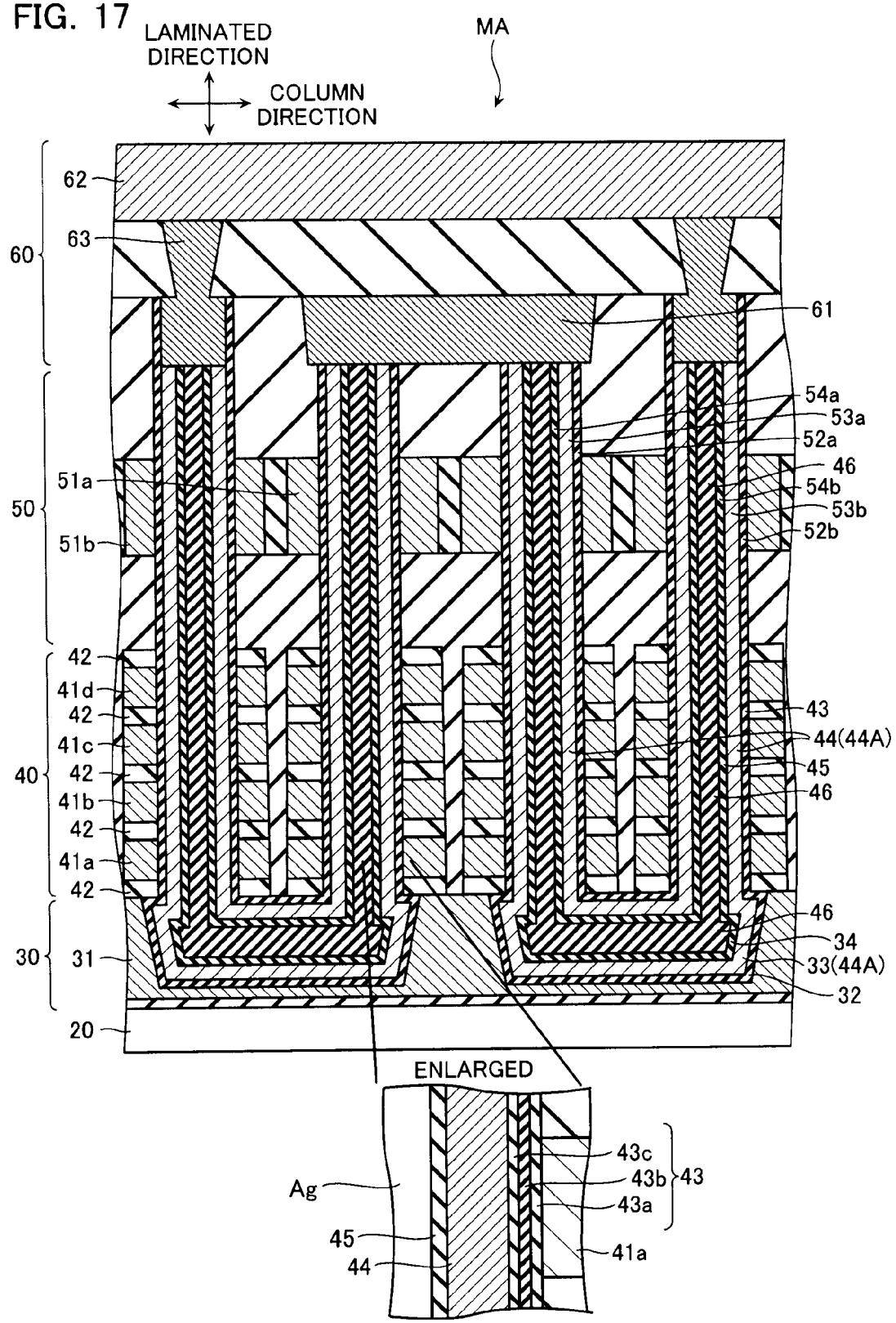
FIG. 17 is a cross-sectional view illustrating the laminated structure of a memory cell array MA according to a second embodiment.

As illustrated in FIG. 17, the second embodiment differs from the first embodiment in that it further includes an inner insulating layer that fills the hollow Ag in the first embodiment. The inner insulating layer 46 is made of, for example, a silicon oxide ($SiO_2$). In the structure, the second embodiment has the same effect as the first embodiment.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 18:
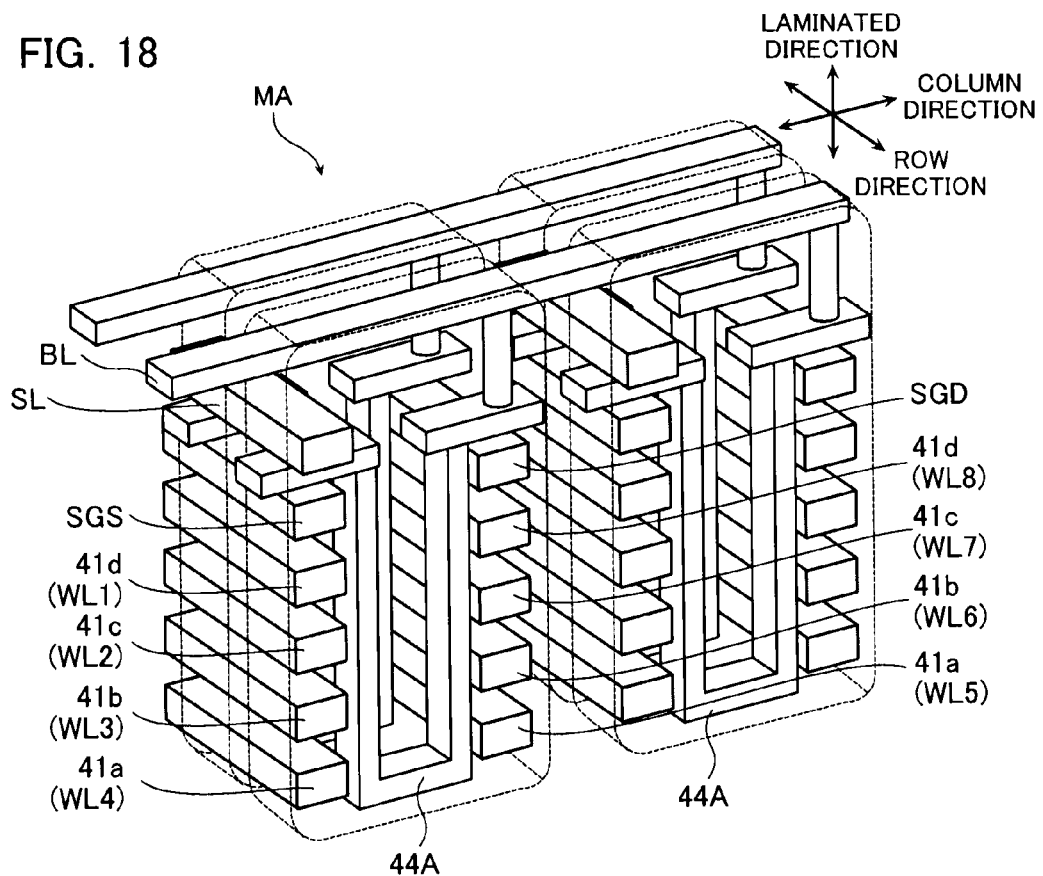
FIG. 18 is a perspective view illustrating the laminated structure of a memory cell array MA according to another embodiment.

For example, in the above-described embodiments, the word line conductive layers 41a to 41d surround the memory semiconductor layer 44A with via memory gate insulating layer. However, as illustrated in FIG. 18, the ends of the word line conductive layers 41a to 41d in the column direction may come into contact with the memory semiconductor layer 44A through the memory gate insulating layer (not illustrated). That is, the above-described embodiments can be applied to any structure including the semiconductor layer that extends in the laminated direction and functions as the channel of the transistor.

Figure 19:
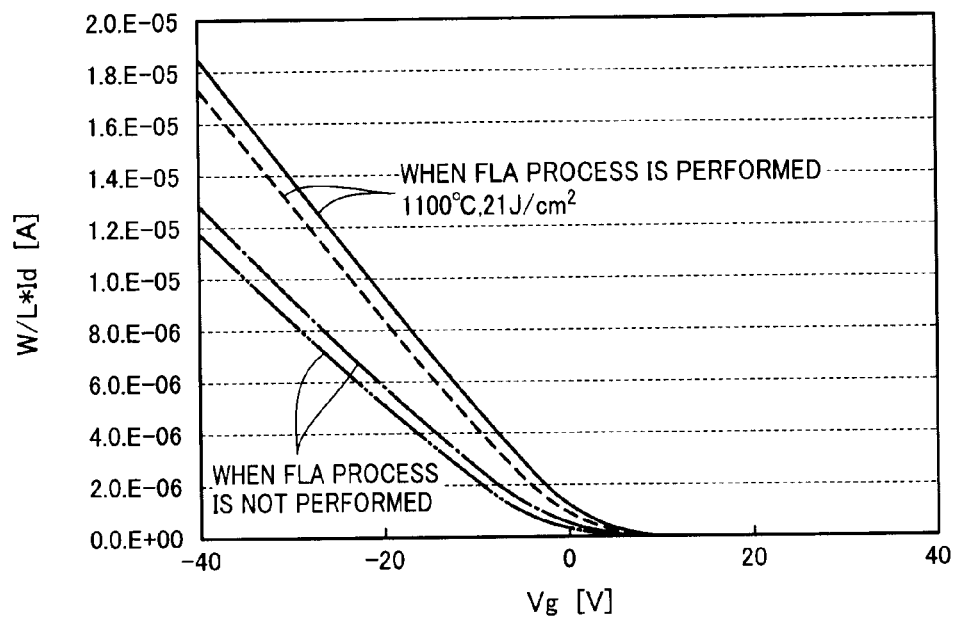
FIG. 19 is a diagram illustrating a variation in characteristics due to an FLA process.

In addition, after the germanium concentration process in the above-mentioned manufacturing method, a flash lamp annealing process (FLA process) may be performed. For example, the FLA process is performed under the conditions of 1100° C. and 21 $J/cm^2$. FIG. 19 is a diagram illustrating a variation in characteristics due to the FLA process. In FIG.

19, the horizontal axis indicates a voltage value Vg applied to the gate of the memory transistor MTr and the vertical axis indicates a value obtained by multiplying a drain current Id of the memory transistor MTr by (gate width W/gate length L). As illustrated in FIG. 19, when the FLA process is performed, the gradient of a straight line in a linear region is more than that when the FLA process is not performed. Channel mobility is proportional to the gradient. As can be seen from FIG. 19, when the FLA is performed, the channel mobility increases. In the example illustrated in FIG. 19, the channel mobility increases 1.4 times.

What is claimed is:

1. A non-volatile semiconductor memory device comprising:
    a semiconductor substrate; and
    a transistor provided on the semiconductor substrate,
    the transistor comprising:
    a conductive layer functioning as a gate of the transistor;
    a gate insulating layer contacting with a side surface of the conductive layer;
    a semiconductor layer having one side surface sandwiching the gate insulating layer with the conductive layer, extending in a direction perpendicular to the semiconductor substrate, and functioning as a body of the transistor; and
    an oxidation layer contacting with the other side surface of the semiconductor layer,
    the semiconductor layer being made of silicon germanium, and
    the oxidation layer being made of a silicon oxide,
    wherein the concentration of germanium in the semiconductor layer increases gradually from the oxidation layer to the gate insulating layer.

2. The non-volatile semiconductor memory device according to claim 1,
    wherein the concentration of germanium in the semiconductor layer is equal to or more than 30%.

3. The non-volatile semiconductor memory device according to claim 1,
    wherein the concentration of germanium in the semiconductor layer is equal to or more than 70%.

4. The non-volatile semiconductor memory device according to claim 1,
    wherein the conductive layer surrounds the semiconductor layer via the gate insulating layer,
    the oxidation layer has a hollow, and
    the transistor further comprises an inner insulating layer filling the hollow.

5. A non-volatile semiconductor memory device comprising:
    a semiconductor substrate; and
    a memory string provided on the semiconductor substrate and comprising a plurality of memory transistors storing data and connected in series,
    the memory string comprising:
    a first conductive layer functioning as a gate of a memory transistor;
    a charge storage layer contacting with a side surface of the first conductive layer and storing charges;
    a first semiconductor layer having one side surface sandwiching the charge storage layer with the first conductive layer, extending in a direction perpendicular to the semiconductor substrate, and functioning as body of the memory transistor; and
    a first oxidation layer contacting with the other side surface of the first semiconductor layer,
    the first semiconductor layer being made of silicon germanium, and
    the first oxidation layer being made of a silicon oxide,
    wherein the concentration of germanium in the first semiconductor layer increases gradually from the first oxidation layer to the charge storage layer.

6. The non-volatile semiconductor memory device according to claim 5,
    wherein the concentration of germanium in the first semiconductor layer is equal to or more than 30%.

7. The non-volatile semiconductor memory device according to claim 5,
    wherein the concentration of germanium in the first semiconductor layer is equal to or more than 70%.

8. The non-volatile semiconductor memory device according to claim 5,
    wherein the first conductive layer surrounds the first semiconductor layer via the charge storage layer,
    the first oxidation layer has a hollow, and
    the memory string further comprises a first inner insulating layer filling the hollow.

9. The non-volatile semiconductor memory device according to claim 5, further comprising:
    a first selection transistor having one end connected to one end of the memory string; and
    a second selection transistor having one end connected to the other end of the memory string,
    wherein the first selection transistor comprises:
    a second conductive layer functioning as a gate of the first selection transistor;
    a first gate insulating layer contacting with a side surface of the second conductive layer;
    a second semiconductor layer having one side surface sandwiching the first gate insulating layer with the second conductive layer, extending in a direction perpendicular to the semiconductor substrate, and functioning as a body of the first selection transistor; and
    a second oxidation layer contacting with the other side surface of the second semiconductor layer,
    the second semiconductor layer is made of silicon germanium, and
    the second oxidation layer is made of a silicon oxide,
    wherein the concentration of germanium in the second semiconductor layer increases gradually from the second oxidation layer to the first gate insulating layer.

10. The non-volatile semiconductor memory device according to claim 9,
    wherein the concentration of germanium in the second semiconductor layer is equal to or more than 30%.

11. The non-volatile semiconductor memory device according to claim 9,
    wherein the concentration of germanium in the second semiconductor layer is equal to or more than 70%.

12. The non-volatile semiconductor memory device according to claim 9,
    wherein the second conductive layer surrounds the second semiconductor layer via the first gate insulating layer,
    the second oxidation layer has a second hollow, and
    the first selection transistor further comprises a second inner insulating layer filling the second hollow.

13. The non-volatile semiconductor memory device according to claim 9,
    wherein the second selection transistor comprises:
    a third conductive layer functioning as a gate of the second selection transistor;
    a second gate insulating layer contacting with a side surface of the third conductive layer;

a third semiconductor layer having one side surface sandwiching the second gate insulating layer with the third conductive layer, extending in the direction perpendicular to the semiconductor substrate, and functioning as a body of the second selection transistor; and a third oxidation layer contacting with the other side surface of the third semiconductor layer, the third semiconductor layer is made of silicon germanium, and the third oxidation layer is made of a silicon oxide.

14. The non-volatile semiconductor memory device according to claim 13,
wherein the concentration of germanium in the third semiconductor layer is equal to or more than 30%.

15. The non-volatile semiconductor memory device according to claim 13,
wherein the concentration of germanium in the third semiconductor layer is equal to or more than 70%.

16. The non-volatile semiconductor memory device according to claim 13,
wherein the third conductive layer surrounds the third semiconductor layer via the second gate insulating layer,
the third oxidation layer has a third hollow, and
the second selection transistor further comprises a third inner insulating layer filling the third hollow.

* * * * *